(12) United States Patent
Stetson

(10) Patent No.: US 8,311,767 B1
(45) Date of Patent: Nov. 13, 2012

(54) MAGNETIC NAVIGATION SYSTEM

(75) Inventor: John B. Stetson, New Hope, PA (US)

(73) Assignee: Lockheed Martin Corporation, Bethesda, MD (US)

( * ) Notice: Subject to any disclaimer, the term of this patent is extended or adjusted under 35 U.S.C. 154(b) by 678 days.

(21) Appl. No.: 12/501,587

(22) Filed: Jul. 13, 2009

(51) Int. Cl.
*G01B 7/004* (2006.01)
(52) U.S. Cl. ................................... 702/152
(58) Field of Classification Search .......... 702/90, 702/92–95, 150–152
See application file for complete search history.

(56) References Cited

U.S. PATENT DOCUMENTS

| | | | |
|---|---|---|---|
| 4,962,504 A * | 10/1990 | Aubert et al. ............... | 372/41 |
| 5,189,168 A | 2/1993 | Malamas | |
| 5,189,368 A | 2/1993 | Chase | |
| 5,387,863 A * | 2/1995 | Lo et al. .................. | 324/207.13 |
| 6,339,328 B1 * | 1/2002 | Keene et al. .............. | 324/248 |
| 7,477,053 B2 | 1/2009 | Pinsky et al. | |
| 8,120,355 B1 * | 2/2012 | Stetson ..................... | 324/244.1 |
| 2005/0138825 A1 * | 6/2005 | Manfred ................... | 33/356 |
| 2009/0212769 A1 * | 8/2009 | Stoica et al. .............. | 324/244.1 |

OTHER PUBLICATIONS

Beyer, William H. Ph.D., "CRC Standard Mathematical Tables", CRC Press, Inc., Cover page, publications page, copyright page, p. 330, Copyright 1981.
Kailath, Thomas, "Linear Systems", Prentice Hall, Inc., Cover page, publication page, copyright page, pp. 656-657, pp. 662-663, p. 664, Copyright 1980.
J.M. Taylor, et al, "High-sensitivity diamond magnetometer with nanoscale resolution", Nature Physics, vol. 4, Oct. 2008, pp. 810-816.

* cited by examiner

*Primary Examiner* — Mohamed Charioui
(74) *Attorney, Agent, or Firm* — Howard IP Law Group, PC

(57) ABSTRACT

A magnetic navigation system senses the three-dimensional magnetic fields of the Earth and compares them with a model of the Earth's magnetic fields. An initial guess as to system location is corrected toward the actual location by accessing magnetic amplitude from library pages in response to corrected location. Error detectors determine amplitude error, which is processed with magnetic gradient information from gradient models to generate the new attitude and location correction values. The correction values are subtracted from the guess to generate the new updated location. The system iterates to continually tend toward the actual location.

20 Claims, 6 Drawing Sheets

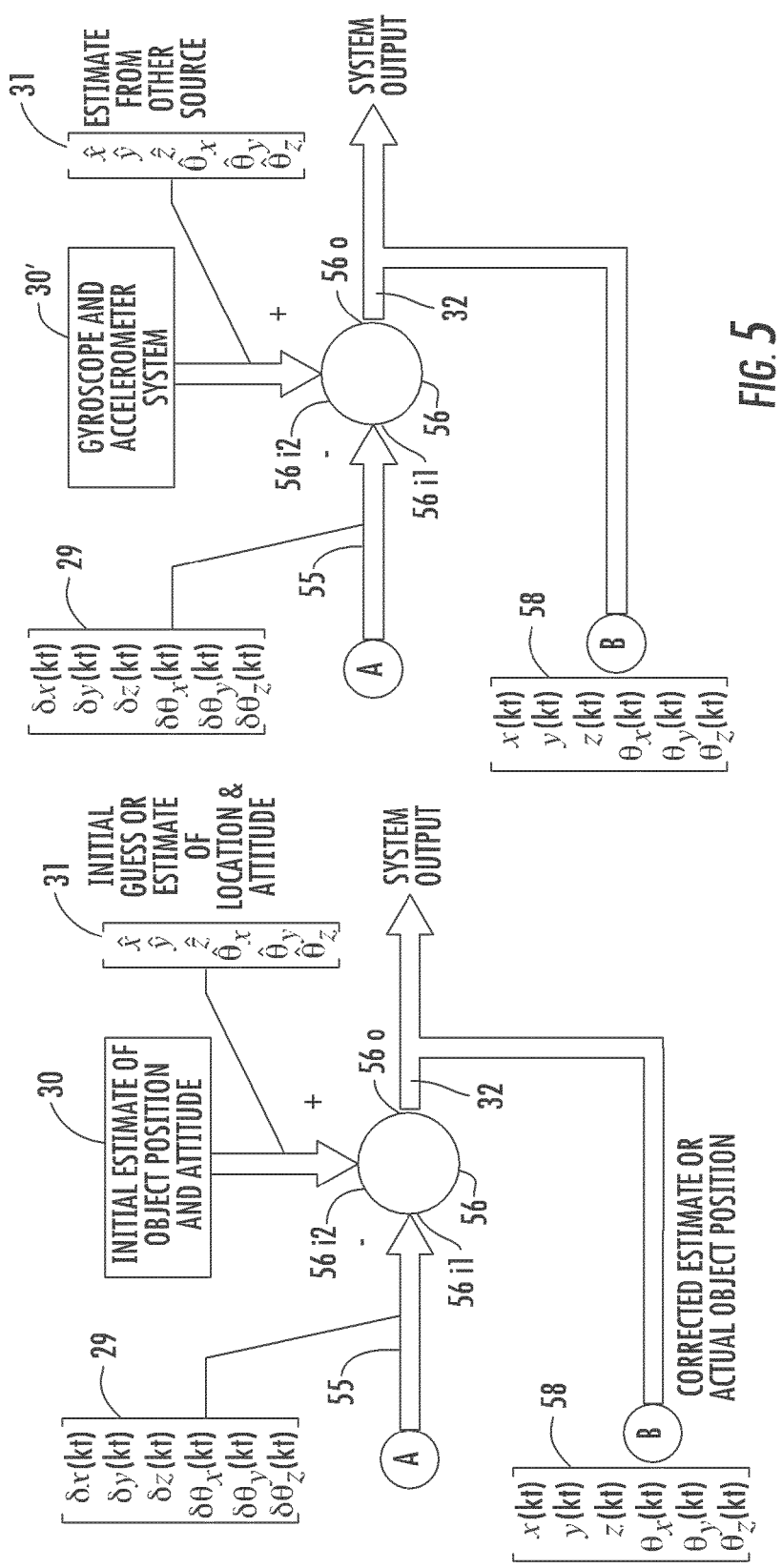

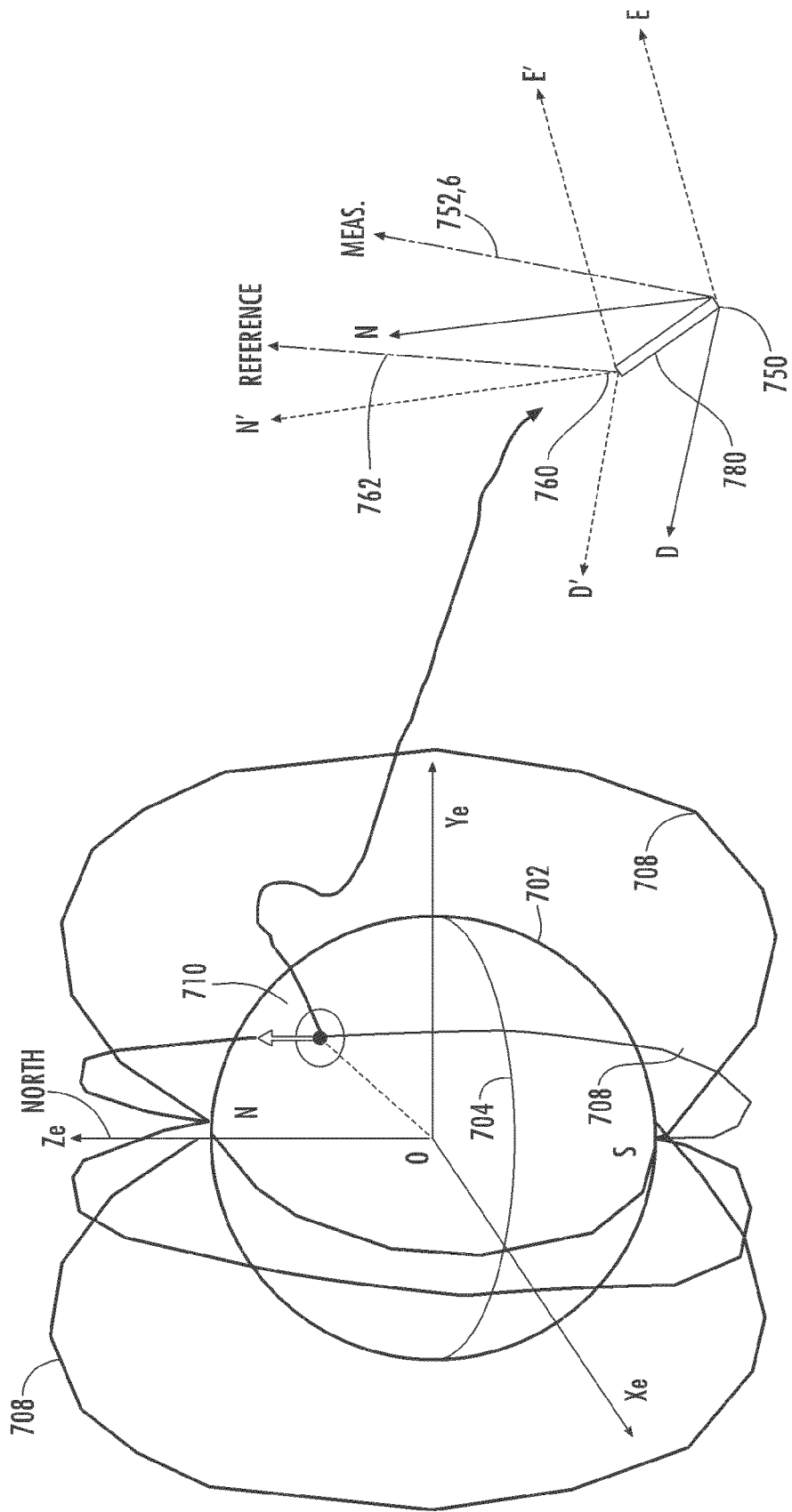

MAGNETIC NAVIGATION SYSTEM

BACKGROUND OF THE INVENTION

Magnetometers are generally used for determining the existence of, and the magnitude of, static or fluctuating or alternating magnetic fields. Some useful applications include spacecraft attitude determination, navigation or geolocation using Earth's magnetic field, and remote detection of magnetic objects, such as submerged submarines.

An ordinary magnetic compass with a "floating" magnetic needle is a form of magnetometer, which has likely been since ancient times to indicate the local direction of the Earth's magnetic field. The magnetized needle has a low-energy state when it is aligned with the local magnetic field.

Other types of magnetometers include various inductor-based arrangements including flux-gate magnetometers, in which a varying excitation voltage is applied to a first coil to produce a magnetic field of varying amplitude and a separate differential secondary coil senses the magnetic field produced by the first coil to thereby generate an output voltage which depends upon the excitation voltage and any intervening magnetic field.

A prior-art electron-spin-detection magnetometer is described in U.S. Pat. No. 5,189,368, issued Feb. 23, 1993 in the name of W. E. Chase. In the Chase magnetometer, describes an electron spin magnetometer in which a first pulsed light source of suitable wavelength excites electron spin precession about the incident magnetic field vector and also results in a phase change between electron quantum energy spin ($+\frac{1}{2}$ and $-\frac{1}{2}$) depending upon the magnitude of the magnetic field. Upon excitation with a second pulse of light, the electron orbits are driven to their ground state, which results either in the release of photons or in grouping of atoms in populations having the $+\frac{1}{2}$ and $-\frac{1}{2}$ spin states, which thereafter decay with time depending upon the nature of the material. The Chase magnetometer uses a third signal or first interrogating signal, which may be a continuous radio-frequency (RF) carrier, which is modulated by the decaying electron spins after the second excitation light pulse, from which modulation the magnitude of the magnetic field may be determined.

An article by J. M. Taylor et al, which appeared at pp 810-816 in the magazine Nature physics, Vol. 4, October 2008, entitled *High-sensitivity diamond magnetometer with nanoscale resolution* describes some prior art and physics of magnetometry. The Taylor et al. article also describes detection of weak magnetic fields taking advantage of coherent control of solid-state electron spin quantum bits. The Taylor et al. magnetometer makes use of solid crystal detection material, which is advantageous in that the effective sensitivity is greater than that of gas-based systems because of the greater density of the sites available for electron excitation.

The principles of magnetometry in the prior art may be explained in conjunction with FIG. 1A, in which a solid-state crystal sensor is illustrated as a block 10. Sensor 10 is composed of an atomic structure allowing electron spin response and subsequent spin alignment with an incident magnetic field, illustrated by an arrow B(t). As described by Taylor et al., the crystal may be carbon atoms in a crystal (diamond) structure, with nitrogen impurities. FIG. 1B illustrates a diamond crystal with carbon atoms, some of which are designated 3. The crystal lattice of FIG. 1B also illustrates a vacancy (V) designated 4, resulting from an offset nitrogen atom 5. In FIG. 1C, the direction of the external or incident magnetic field is illustrated by B(t) arrow 6, and this direction is normal to the vacancy axis. The "vacancy axis" is illustrated as a line 104 extending from the vacancy (V) location to the displaced nitrogen atom (N) location. Also in FIG. 1C, curved arrow 7 shows the direction of precession of the nitrogen atom in response to magnetic field B(t). In the absence of excitation of the vacancy electrons (electrons of atoms adjacent the vacancy), their quantum energy levels are identical, as suggested by the equal lengths of energy-level-representative arrows 8.

FIG. 1D is similar to FIG. 1C, and shows the result of a first excitation pulse 9 of light at a wavelength of 532 nanometers (nm) and with a duration of T seconds. The wavelength of the light pulse is selected to excite electron spin precession about the incident magnetic field B(t), which also results in a corresponding phase change between electron quantum energy spin ($+\frac{1}{2}$ or $-\frac{1}{2}$) spin states. The phase differences in the spin states of the vacancy electrons resulting from this excitation are illustrated as a two-headed arrow 10. The phase difference of the vacancy's quantum electron energy levels is proportional to the spin precession. FIG. 1E illustrates application of a second pulse 11 of green light at the same 532 nm wavelength and with duration T seconds. The excitation of the electron states attributable to the second pulse is out-o-phase with the excitation attributable to the first pulse. That is, the timing T of the second pulse relative to the first pulse is selected so that the previously excited electron states 10 are driven to ground energy level or state. As a result of the transition to the ground state, the electrons emit red-light photons illustrated as 12, and the number of the red-light photons is proportional to the phase difference, which in turn is proportional to the magnitude of the incident magnetic field B(t).

The single-axis Taylor et al. magnetometer described in conjunction with FIGS. 1A, 1B, 1C, 1D, and 1E is highly sensitive to magnetic fields, at least in part because of the large number of sensing (vacancy) sites per unit volume in the solid diamond lattice. This number of sensing sites much exceeds that of gas-based sensors.

SUMMARY OF THE INVENTION

A magnetic navigation device according to an aspect of the invention comprises a three-axis magnetometer including first, second and third single-axis channels oriented mutually orthogonally, in which each of the first, second and third channels is responsive to Earth's magnetic field for generating measured signal proportional to the component of the magnetic field in the direction of the channel. The magnetic navigation device also comprises a source of reference Earth magnetic field component information responsive to corrected location and attitude signal. First, second, and third error detectors are provided, each including a sum input port and a difference input port, and each also including an output port. The sum input ports of the first, second, and third error detectors are coupled to receive the measured signal from the first, second and third channels, respectively. The difference input ports of each of the first, second, and third error detectors are coupled to receive the reference Earth magnetic field component information, for subtracting from the measured signals the corresponding component of the reference Earth magnetic field component information to thereby generate, in each of the first, second and third channels, magnetic field difference signals representing the difference between the measured magnetic fields at the location and the reference Earth magnetic field component values or information at the location. A first processor is provided, for assembling the magnetic field difference signals into a difference column vector representing the magnetic field differences between the measured magnetic field and the reference magnetic field values at the location. A source is provided of inverted differential correction matrix or matrices responsive to a corrected location and attitude vector. The inverted differential correction matrix represents the pseudo inverse of an attitude and location sensitivity matrix providing directional action for the reference magnetic field. A vector matrix multiplier includes a first input port coupled to the first processor, for receiving the difference column vector at the first input port, and also includes a second input port coupled to receive the inverted differential correction matrix. The vector matrix multiplier multiplies the difference column vector by the inverted differential correction matrix, for generating a column vector representing corrections to the corrected location and attitude vector. A source of ancillary signals is provided. The ancillary signals are one of (a) initial estimated location and attitude and (b) estimated location and attitude from an independent navigation location estimator. A vector differencing processor includes an inverting input port and a noninverting input port. The inverting input port of the vector differencing processor is coupled to the vector matrix multiplier for receiving the corrections to the corrected location and attitude vector, and the noninverting input port is coupled to the source of ancillary signals. The vector differencing processor takes the difference between the ancillary signals and the corrections to the location and attitude vector, for thereby generating a corrected location and attitude column vector representing the corrected location and attitude.

In a particular embodiment of a magnetic navigation system, the source of inverted differential correction matrix comprises a further or magnetic field gradient correction matrix processor responsive to the corrected location and attitude vector, for generating a magnetic field gradient correction matrix representing the spatial or 3-dimensional rate of change of the Earth's magnetic field as a function of the corrected location and attitude. A scalar-to-column-vector processor is coupled to the source of reference Earth magnetic field component information for converting the reference Earth magnetic field component information from scalar form into column vector form. A matrix assembly processor is coupled to the further or magnetic field gradient correction matrix processor for receiving the magnetic field gradient correction matrix, and coupled to the scalar-to-column-vector processor for receiving the column vector, for forming a skew-symmetric matrix of the column vector, and for multiplying the column vector by the magnetic field gradient correction matrix to form a product, and for column formatting the skew-symmetric matrix with the product matrix to form an overall magnetic field gradient correction matrix. A Moore-Penrose pseudoinverse processor is coupled to the matrix assembly processor for generating the Moore-Penrose pseudoinverse of the magnetic field gradient correction matrix to thereby generate the inverted differential correction matrix.

In a particular embodiment of a three-axis magnetometer according to an aspect of the invention, each of the three axes includes a photoresponsive solid-state crystalline device with lattice imperfections associated with certain electrons, which lattice imperfections electrons resonate at a given wavelength. Each channel further includes a source of timed sequential pairs of light pulses at the given wavelength. The source is directed toward the crystalline device, whereby (a) the first of the pulses of each pair of light pulses raises the energy state of the electrons over a ground state, thereby creating distinct quantum spin state populations, and (b) the second of the pulses of each pair of pulses occurs at a time such that the energy state of the electrons is reduced to the ground state, whereby (c) the reduction of the energy state generates photons which exit the crystalline device. The number of photons exiting the crystalline device is related to the magnitude of a component of the magnetic field through the crystalline device. A photon detector responds to the photons and generates an electrical signal in response to the photons. An analog-to-digital converter converts the electrical signal into digital form.

A method for navigation according to an aspect of the invention includes the steps of sensing the Earth's magnetic fields at the current location, to thereby generate measured three-dimensional magnetic fields, and addressing a reference library of magnetic values with at least a portion of a column vector $$\begin{bmatrix} x \\ y \\ z \\ \Theta_x \\ \Theta_y \\ \Theta_z \end{bmatrix}$$

representing a corrected estimate of location and attitude, to thereby obtain library values of the magnetic fields at the corrected estimated location. The method further comprises the step of applying the measured three-dimensional magnetic fields and the library values of the magnetic fields at the corrected estimated location to ports of error amplifiers, to thereby generate three scalar quantities representing difference signals between the values of the measured magnetic fields and the library values of the magnetic fields at the corrected estimated location. The three scalar quantities representing difference signals are converted into column vector form:

$$\begin{bmatrix} \delta B_x(kt) \\ \delta B_y(kt) \\ \delta Bz(kt) \end{bmatrix}.$$

The column vector representing difference signals is applied to a first input port of a vector matrix multiplier, and a gradient correction matrix is applied to a second input port of the vector matrix multiplier. Matrix multiplication is performed in the vector matrix multiplier to thereby produce a column vector $$\begin{bmatrix} \delta x(kt) \\ \delta y(kt) \\ \delta z(kt) \\ \delta\Theta_x(kt) \\ \delta\Theta_y(kt) \\ \delta\Theta_z(kt) \end{bmatrix},$$

representing the correction to the corrected estimated location and attitude. The current location is estimated, to thereby generate an estimated location and attitude column vector $$\begin{bmatrix} \hat{x} \\ \hat{y} \\ \hat{z} \\ \hat{\Theta}_x \\ \hat{\Theta}_y \\ \hat{\Theta}_z \end{bmatrix}$$

The column vector $$\begin{bmatrix} \delta x(kt) \\ \delta y(kt) \\ \delta z(kt) \\ \delta \Theta_x(kt) \\ \delta \Theta_y(kt) \\ \delta \Theta_z(kt) \end{bmatrix},$$

representing the correction to the corrected estimate of the location and attitude, is subtracted from the column vector representing estimated location and attitude, to thereby generate the column vector representing a corrected estimate of the location and attitude.

A particular mode of the method includes the step of forming the library values of the magnetic fields at the corrected estimated location into a library Cartesian value column vector $$\begin{bmatrix} \delta B_x(kt) \\ \delta B_y(kt) \\ \delta B_z(kt) \end{bmatrix}.$$

A magnetic field gradient correction matrix $$H = \begin{bmatrix} \frac{\delta Bxx}{\delta x} & \frac{\delta Bxy}{\delta x} & \frac{\delta Bxz}{\delta x} \\ \frac{\delta Byx}{\delta y} & \frac{\delta Byy}{\delta y} & \frac{\delta Byz}{\delta y} \\ \frac{\delta Bzx}{\delta z} & \frac{\delta Bzy}{\delta z} & \frac{\delta Bzz}{\delta z} \end{bmatrix}$$

is generated, which represents correction of the gradient of the column vector representing the library values. Matrix assembly processing is performed on the magnetic field gradient correction matrix and the library value column vector, to thereby generate a differential correction matrix including (a) a skew-symmetric submatrix which is the skew-symmetric matrix of the library value column vector and also including (b) a submatrix which is the product of the magnetic field gradient correction matrix multiplied by the Cartesian magnetic field column vector. Moore-Penrose pseudoinverse processing is performed on the differential correction matrix to thereby generate the gradient correction matrix.

Another method according to an aspect of the invention comprises the steps of sensing the Earth's magnetic fields at the current location, to thereby generate measured three-dimensional magnetic fields, and addressing a reference library of magnetic values with at least a portion of a column vector $$\begin{bmatrix} x \\ y \\ z \\ \Theta_x \\ \Theta_y \\ \Theta_z \end{bmatrix}$$

representing a corrected estimate of location and attitude, to thereby obtain library values of the magnetic fields at the corrected estimated location. Three scalar quantities representing error signals are generated by taking the differences between the measured three-dimensional magnetic fields and the library values of the magnetic fields at the corrected estimated location. The three scalar quantities representing error or difference signals are converted into column vector form:

$$\begin{bmatrix} \delta B_x(kt) \\ \delta B_y(kt) \\ \delta B_z(kt) \end{bmatrix}$$

The column vector representing difference signals is multiplied by a gradient correction matrix, to thereby produce a column vector $$\begin{bmatrix} \delta x(kt) \\ \delta y(kt) \\ \delta z(kt) \\ \delta \Theta_x(kt) \\ \delta \Theta_y(kt) \\ \delta \Theta_z(kt) \end{bmatrix},$$

representing the correction to the corrected estimated location and attitude. The current location is estimated (or equivalently measured by a separate navigator), to thereby generate an estimated location and attitude column vector $$\begin{bmatrix} \hat{x} \\ \hat{y} \\ \hat{z} \\ \hat{\Theta}_x \\ \hat{\Theta}_y \\ \hat{\Theta}_z \end{bmatrix}$$

The column vector $$\begin{bmatrix} \delta x(kt) \\ \delta y(kt) \\ \delta z(kt) \\ \delta \Theta_x(kt) \\ \delta \Theta_y(kt) \\ \delta \Theta_z(kt) \end{bmatrix},$$

representing the correction to the corrected estimate of the location and attitude, is subtracted from the column vector representing estimated location and attitude, to thereby generate the column vector representing a corrected estimate of the location and attitude.

A particular mode of this other method for navigation comprises the further steps of forming the library values of the magnetic fields at the corrected estimated location into a library Cartesian value column vector $$\begin{bmatrix} B_x(kt) \\ B_y(kt) \\ B_z(kt) \end{bmatrix}$$

A magnetic field gradient correction matrix is generated. The magnetic field gradient correction matrix $$H = \begin{bmatrix} \frac{\delta Bxx}{\delta x} & \frac{\delta Bxy}{\delta x} & \frac{\delta Bxz}{\delta x} \\ \frac{\delta Byx}{\delta y} & \frac{\delta Byy}{\delta y} & \frac{\delta Byz}{\delta y} \\ \frac{\delta Bzx}{\delta z} & \frac{\delta Bzy}{\delta z} & \frac{\delta Bzz}{\delta z} \end{bmatrix}$$

represents correction of the gradient of the column vector representing the library values. The magnetic field gradient correction matrix and the library Cartesian value column vector are matrix assembled, to thereby generate a differential correction matrix. The differential correction matrix includes (a) a skew-symmetric submatrix which is the skew-symmetric matrix of the library value column vector and also includes (b) a submatrix which is the product of the magnetic field gradient correction matrix multiplied by the library Cartesian value column vector. Moore-Penrose pseudoinverse processing is performed on the differential correction matrix to thereby generate the gradient correction matrix.

BRIEF DESCRIPTION OF THE DRAWING

FIGS. 3A and 3B together are a simplified block diagram of a magnetic navigation system using the apparatus of FIG. 2;

FIG. 4A is a simplified diagram illustrating fields of lines of magnetic force surrounding the Earth, and FIG. 4B illustrates various directions and vectors associated with the magnetic fields at a particular location;

FIG. 5 is a simplified block diagram of a magnetic field position or location sensitivity computation arrangement of FIG. 3A.

DESCRIPTION OF THE INVENTION

Figure 1A:
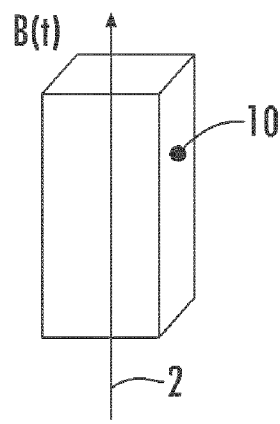
FIG. 1A is a simplified representation of a prior-art solid crystal magnetic sensor.
Figure 1B:
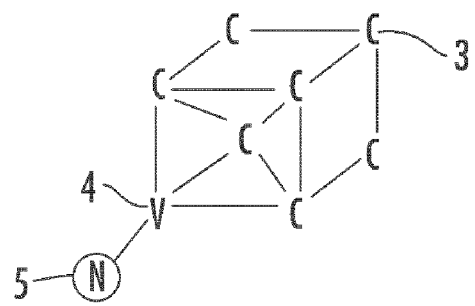
FIG. 1B is a representation of diamond crystal lattice with nitrogen-caused vacancy sites which can be used in the sensor of FIG. 1A.
Figure 1C:
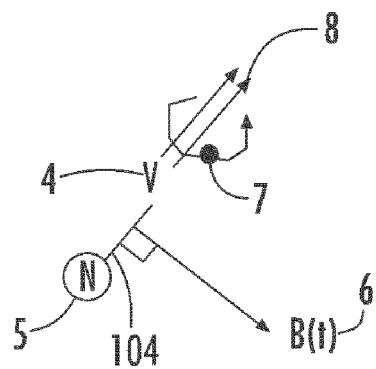
FIG. 1C illustrates a precession direction in response to a magnetic field in the absence of electron excitation.
Figure 1D:
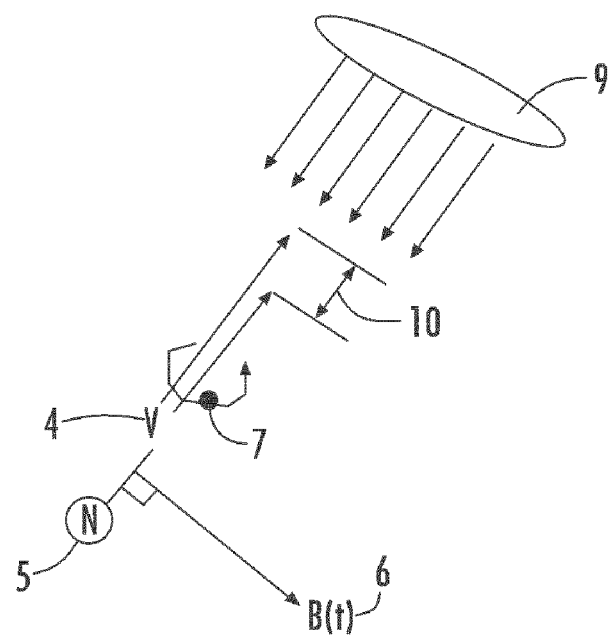
FIG. 1D illustrates the result of illuminating the crystal lattice of FIG. 1C with an excitation light pulse selected to excite electron spin precession about an incident magnetic field.
Figure 1E:
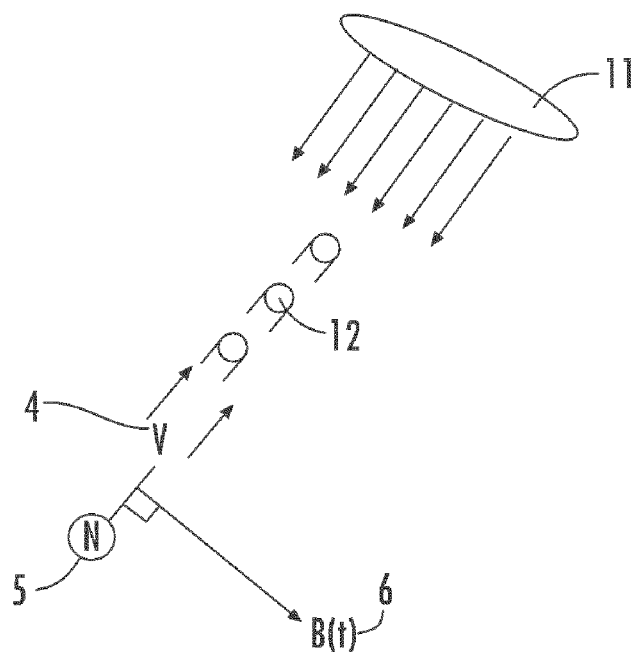
FIG. 1E illustrates the emission of red photons in response to the application of an out-of-phase light pulse.
Figure 1F:
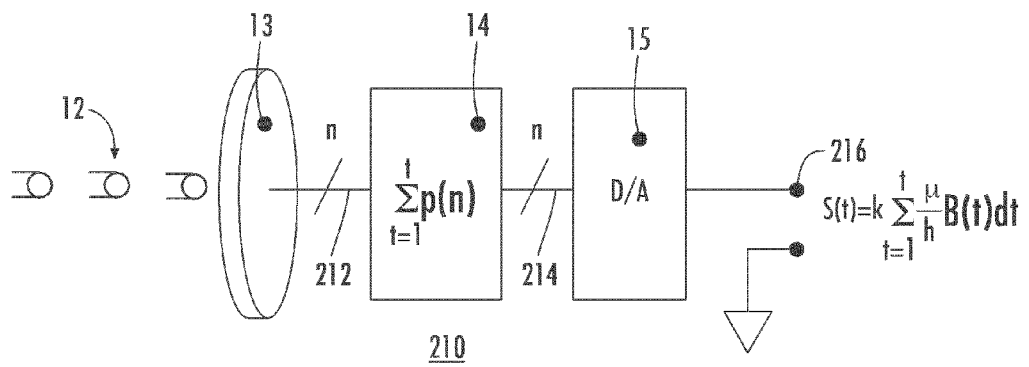
FIG. 1F is a simplified diagram of a sensor according to an aspect of the invention for converting emitted red photons to an electrical signal representing the strength of a magnetic field component.

FIG. 1F illustrates the photons of red light 12 applied to a charge-coupled two-dimensional imaging array device illustrated as 13 within an apparatus 210. Imaging device 13 includes n cells, and converts the incident red light into electrical signal in the form of charge. In theory, it would be possible to use a single photodetector element, but as the light radiation leaving the crystal sensor may not be confined to a single direction, the detection must take place over a finite area. The photon-representative electron charge is coupled over n parallel paths 212 to an accumulator or integrator illustrated as a block 14, which accumulates the charge for a period τ to produce integrated signal. The total integrated charge for each cycle of the accumulator is represented by a digital number, which is coupled over a path 214 to a digital-to-analog converter (DAC or D/A) 15. DAC 15 converts the digital number representing the number of red photons detected during the current interval τ into an analog or analogue signal S(t) proportional to the incident magnetic field component B(t). The analog signal appears at port 216, and may be written as $$S(t) = k \sum_{t=1}^{i} \frac{\mu}{h} B(t) dt$$

where:
  k is a calibration scale factor;
  i is the upper count value of summing index time, t;
  μ is the Bohr Magneton, a natural physical constant; and
  h is Planck's constant, a natural physical constant.

Figure 2:
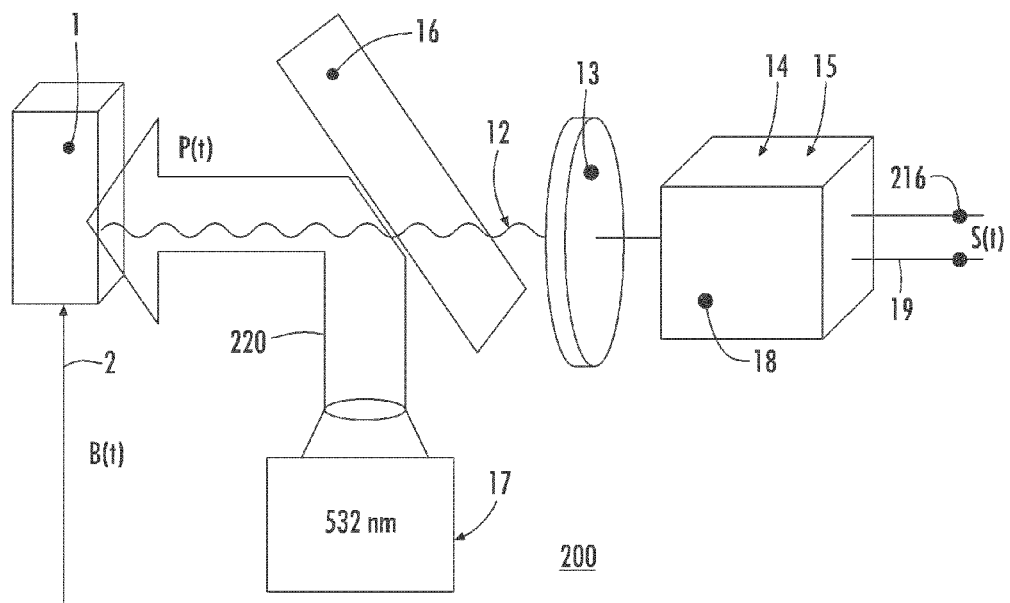
FIG. 2 is a simplified diagram illustrating an apparatus for generating an electrical signal in response to the magnitude of a component of a magnetic field.

FIG. 2 illustrates generally the same magnetic detector structure 200 as that described in conjunction with FIGS. 1A, 1B, 1C, 1D, 1E, and 1F, and shows some additional details. Elements of sensor 200 of FIG. 2 corresponding to those of other FIGURES are designated by like alphanumerics. In FIG. 2, nitrogen-vacancy diamond crystal sensor 1 has an applied magnetic field component B(t). A controlled light pulse source 17 at a wavelength of 532 nanometers (nm) produces pairs of light pulses, illustrated as an arrow 220, which impinge on a semitransparent or wavelength-selective mirror 16. Mirror 16 reflects the 532 nm light toward the crystal sensor 1, to thereby excite the electron states. After the second pulse of each pulse pair, the sensor emits red light illustrated by a photon symbol 12, which leaves the sensor and passes through wavelength-selective mirror 16 and arrives at the photodetector 13. Photodetector 13 produces electrical signal proportional to the magnitude of the magnetic field 2, which signal is applied to a block illustrated as 18. Block 18 incorporates the functions of accumulator 14 and DAC 15, to thereby produce the analog signal S(t) at port 216.

According to an aspect of the invention, a magnetic navigation device includes a three-axis magnetometer which may be viewed as including three sensors such as 200 of FIG. 2, each responsive to magnetic field components aligned with three mutually orthogonal axes. The magnetometer senses the Earth's three-axis magnetic field vector. FIG. 4A is a simplified illustration of the Earth 702, showing a North Pole N, South Pole S. and equator 704. A meridian extending from N to S poles is illustrated as 706. Lines of magnetic force produced by the Earth are illustrated as 708, and "emanate" from the S pole and "flow" to the N pole. A Cartesian coordinate system is superposed over the Earth 702 and includes an origin O at the center of the Earth, and also includes mutually orthogonal $x_e$, $y_e$, and $z_e$ axes. The z axis of the Cartesian coordinate system extends from origin O toward the N pole.

Navigation on the Earth is based on measurements of "latitude" and "longitude." Longitude is the angular measure from any meridian to the Prime Meridian which passes through Greenwich, England, and ranges from 0° to +180° when traveling east from Greenwich, and from 0° to −180° when traveling west. Latitude is measured by angle from the equator, with northern locations having values that range from 0° to +90°, and southern locations having values ranging from 0° to −90°. The Earth's magnetic field extends generally "from" the South Pole (S) to the North Pole (N), in lines that have three-dimensional structure as described in conjunction with FIG. 4A. Determination of latitude from consideration of the local magnetic field is conceptually easy to understand. For example, near the poles the field has a very large vertical component (relative to the local surface), and near the equator the field has a very small vertical component. Thus, by knowing the ratio of the vertical to the horizontal components of the magnetic field, it is possible to deduce the latitude. At equal North and South latitudes, the ratio of vertical to horizontal will theoretically be the same, but at North latitudes the vertical component will point downward, while at South latitudes the vertical component will point upward. Thus, the ratio of vertical to horizontal components of the Earth's magnetic field, together with the direction of the vertical component, can be used to determine North and South latitude.

Longitude is determined in a generally similar manner. More particularly, East and West directions or angle are determined by examining the measured East-West components of the Earth's magnetic field. FIG. 4B illustrates the magnetic field structure at location 710 of FIG. 4A, emphasizing the more detailed structure of the overall magnetic field vector shown by the dark arrow of FIG. 4A. In FIG. 4B, the actual location of the sensor 200 is designated 750. The Cartesian North, East, and down directions relative to actual location 750 are represented by solid arrows designated N, E, and down (D), respectively. The actual Earth's magnetic field as sensed at location 750 is represented by a dotted actual measured magnetic field vector 752. The location designated 760 represents the estimated or postulated location, based on comparisons of the sensed magnetic field with library or reference magnetic fields. The estimated or postulated Cartesian North, East, and down directions at location 760 are represented by dash lines designated N', E', and D', respectively. A displacement vector illustrated as a bar 780 represents the displacement between the actual and estimated locations or positions 750 and 760. A dot-dash vector designated 762 represents the estimated or postulated Earth's magnetic field vector at location 760. There is expected to be a difference between the actual location 750 of the sensor and the estimated location 760. The magnetic field structure at actual location 750 will differ from that at estimated location or position 760. While the various corresponding vectors appear to be parallel as illustrated in FIG. 4B, they measurably diverge, and the divergence can be used to determine the magnitude and direction of the displacement vector 780. The attitude of the sensor can also be determined in generally similar fashion.

Figure 3A:
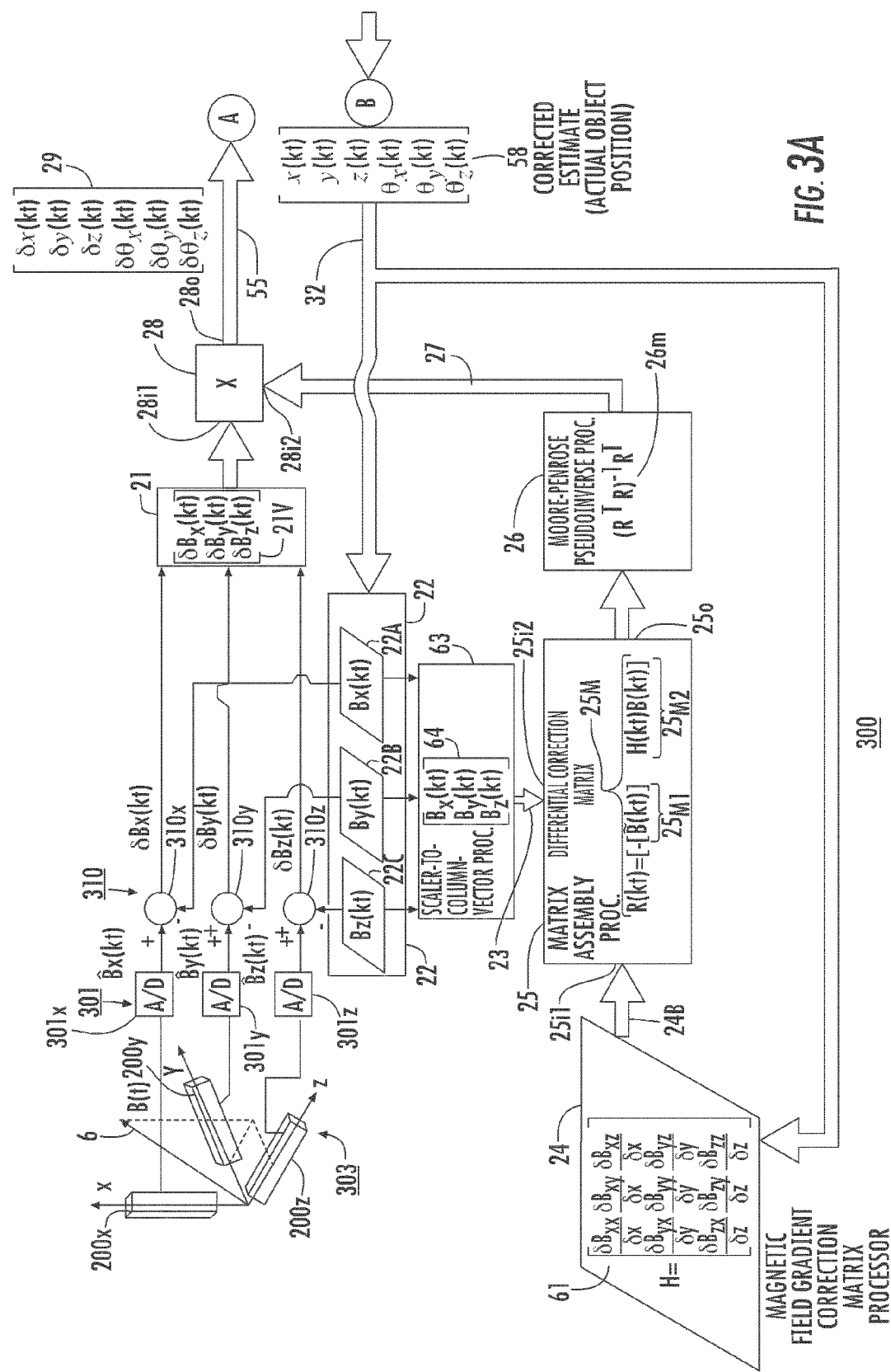

FIGS. 3A and 3B together illustrate a navigation system according to an aspect of the invention. In FIGS. 3A and 3B, sensors designated 200X, 200Y and 200Z correspond to arrangement 200 of FIG. 2, with each sensor being responsive to one of X, Y, and Z magnetic field components of an overall field B(t) designated 6. The measured X Cartesian component analog signal in the magnetometer frame are applied to a set of analog-to-digital converters (A/D) 301x, 301y, and 301z, respectively, to thereby produce time and amplitude quantized (digital) signals $\hat{B}x(kt)$, $\hat{B}y(kt)$, and $\hat{B}z(kt)$. It will be understood by those skilled in the art that the overhat notation applied herein to the quantized (digital) signals $\hat{B}x(kt)$, $\hat{B}y(kt)$, and $\hat{B}z(kt)$ and other variables in evidence represents measured values of the Earth magnetic field, these measurements corrupted with noise and bias error resulting from location and attitude error. These digitized x, y, and z signals are applied to the noninverting (+) input ports of error detectors or subtractors 310A, 310B, and 310C, respectively, of a set 310 of error detectors. The inverting (−) input ports of error detectors 310A, 310B, and 310C receive time-synchronized (at time kt) library values Bx(kt), By(kt), and Bz(kt), respectively, of the magnetic fields at the corrected estimated location from x, y, and z library components 22A, 22B, and 22C, respectively, of a reference library 22. Each error detector 310A, 310B, and 310C takes the difference between the signals applied to its inverting and noninverting input ports to produce digitized difference signals δBx(kt), δBy(kt), and δBz(kt), respectively. The three digitized difference signals δBx(kt), δBy(kt), and δBz(kt) are applied to a processor 21. Processor 21 assembles the three scalar components into a column vector 21V representing magnetic field differences between the measured and reference (library) values. The resulting column vector 21V $$\begin{bmatrix} \delta B_x(kt) \\ \delta B_y(kt) \\ \delta Bz(kt) \end{bmatrix}$$

is applied to a first input port 28i1 of a vector matrix multiplier (X) block 28. Multiplier block 28 also receives at a second input port 28i2 from a path 27 a gradient correction matrix designated 26m. Multiplier 28 performs vector matrix multiplication to thereby produce at an output port 28o a column vector $$\begin{bmatrix} \delta x(kt) \\ \delta y(kt) \\ \delta z(kt) \\ \delta\Theta_x(kt) \\ \delta\Theta_y(kt) \\ \delta\Theta_z(kt) \end{bmatrix}$$

designated 29. Column vector 29 represents the correction or update to the corrected location and attitude.

The column vector 29 representing the correction to the object location and attitude is applied from vector matrix multiplier 28, over a path 55 and a junction A of FIG. 3A to an inverting (−) input port 56i1 of a vector differencing processor 56 of FIG. 3B. Vector differencing processor 56 also receives at a noninverting (+) second input port 56i2 ancillary signals from a source 30. The ancillary signals represent an initial guess or initial estimate of the object location and attitude in the form of a column vector $$\begin{bmatrix} \hat{x} \\ \hat{y} \\ \hat{z} \\ \hat{\Theta}_x \\ \hat{\Theta}_y \\ \hat{\Theta}_z \end{bmatrix}$$

designated 31. Vector difference processor 56 takes the difference between the location and attitude correction vector 29 and the initial guess or estimate vector 31 of the location and attitude to thereby produce at its output port 56o and on a path 32 another column vector $$\begin{bmatrix} x \\ y \\ z \\ \Theta_x \\ \Theta_y \\ \Theta_z \end{bmatrix}$$

illustrated as 58, representing the corrected estimate of location and attitude. The corrected estimated location and attitude may also be viewed as being the actual object location and attitude, as best as the navigation system 300 can determine. This corrected object location and attitude, represented by column vector 58, is used as the output of the navigation system 300. Thus, after one or more iterations of the navigator 300, the corrections will converge toward values which, when combined with the initial estimate of location and attitude from block 30, best represent the actual object location and attitude with respect to the earth reference coordinate frame.

The Cartesian location portion (that is, the x, y, and z values (but not the θx, θy, or θz attitude values) of the corrected estimated location and attitude (output) column vector 58 (representing the best current estimate of the location of the system 300) are applied by way of path 32 and a junction B of FIG. 3B to a further or magnetic field gradient correction matrix processor 24 of FIG. 3A and to a magnetic reference library illustrated as a block 22. Magnetic reference library block 22 of FIG. 3B includes three sections designated Bx(kt) or 22A, By(kt) or 22B, and Bz(kt) or 22C, which contain reference Cartesian x, y, and z magnetic field values, respectively, covering at least the areas of interest, and which ideally would be a global model. The Cartesian positional components (x,y,z) of corrected output column vector 58 individually address the magnetic memory portions, to select pages of memory representing magnetic field components at the corrected location. These pages of memory include details of the x, y, and z magnetic fields at the corrected location, which details are made available, or applied, to the inverting (−) input ports of error detectors or subtractors 310A, 310B, and 310C, respectively. Error detectors 310A, 310B, and 310C generate differences as described above, which are turned into column vector 21 and applied to input port 28i1 of multiplier 28, also as described above.

In addition to applying the corrected location and attitude vector 58 to memory 22, path 32 also applies the corrected location and attitude vector to further or magnetic field gradient correction matrix processor 24. Magnetic field gradient correction matrix processor 24 applies the current corrected location to address a model of the Earth's magnetic field, and computes (or reads from a table, as applicable) a magnetic field gradient correction matrix (H) on a path 24B.

$$H = \begin{bmatrix} \frac{\delta Bxx}{\delta x} & \frac{\delta Bxy}{\delta x} & \frac{\delta Bxz}{\delta x} \\ \frac{\delta Byx}{\delta y} & \frac{\delta Byy}{\delta y} & \frac{\delta Byz}{\delta y} \\ \frac{\delta Bzx}{\delta z} & \frac{\delta Bzy}{\delta z} & \frac{\delta Bzz}{\delta z} \end{bmatrix}$$

This matrix magnetic field gradient correction matrix is designated 61 in FIG. 3A, and represents the spatial or 3-dimensional rate of change of the Earth's magnetic field model as a function of the corrected location and attitude.

The matrix magnetic field gradient correction matrix designated 61, representing the spatial or 3-dimensional rate of change of the Earth's magnetic field model as a function of the corrected location (but not attitude), is coupled from magnetic field gradient correction matrix processor 24 of FIG. 3A by way of path 24B to an input port 25i1 of an additional or matrix assembly processor 25. A block 63 of FIG. 3A receives from memories 22 the selected pages of memory representing magnetic field components at the corrected location. As mentioned, these pages of memory include details of the x, y, and z magnetic fields at the corrected location. Block 63 arranges the scalar magnetic field components into a column vector $$\begin{bmatrix} B_x(kt) \\ B_y(kt) \\ B_z(kt) \end{bmatrix}$$

illustrated as 64, which represents a Cartesian, 3-dimensional description of the reference or library magnetic field. Column vector 64 is applied over a path 23 to an input port 25i2 of matrix assembly processor 25. Matrix assembly processor 25 forms a differential correction matrix R or R(kt) at discrete time kt by multiplying magnetic field gradient correction matrix 61 by Cartesian column vector 64, and applies the resulting matrix differential correction R to output port 25o. Matrix R(kt) is given by R(kt)=[−[B̃(kt)]H(kt)B(kt)], and is designated 25M. Matrix R(kt) includes a first portion submatrix designated 25M1 defined as [B̃(kt)] which is the skew-symmetric matrix of column vector 64. Matrix R(kt) also includes a second portion submatrix designated 25M2 defined as the product H(kt)B(kt) of the magnetic field gradient correction matrix designated 61 multiplied by Cartesian magnetic field column vector 64. Matrix R represents the differential correction matrix for object location and attitude vector 58 with reference to library magnetic field vector 64. Matrix R flows from matrix assembly processor block 25 output port 25o to processor block 26. Block 26 forms the Moore-Penrose pseudoinverse of matrix R designated as matrix 26M and defined as $(R^T R)^{-1} R^T$ representing the "action" matrix that multiplies the magnetic field error signals 21V to produce corrected location and attitude vector 29.

In operation of the structure 300 of FIGS. 3A and 3b, an initial guess of an object's attitude and location (position) is generated and inserted into block 30. Magnetic fields are sensed by sensor 303, and digitized in set 301 of A/D blocks. The digitized measured magnetic fields are converted into matrix form and multiplied in multiplier 28 by the action matrix applied through path 27. The product is the corrected object location and attitude vector 29. Vector 29 is subtracted in summing junction 56 from the initial guess of the object's location and attitude, to thereby produce the corrected object location and attitude. The corrected object location and attitude is applied to library 22 to select the appropriate Earth magnetic reference component, and is also applied to compute the gradient matrix 61 of the Earth's magnetic field to refine and correct the action matrix. The loop iterates to tend to make the corrected location and attitude correspond to the actual location and attitude. It will be understood that the initial estimate of location and location may itself be updated. In general, however, the system will continually tend toward the actual current location even if the initial estimate is not updated, or even if the initial estimate is much in error.

While the various processes and steps associated with FIGS. 3A and 3B have been described separately, those skilled in the art know that the various separate processes may be performed by a single programmed processor, or by suitable separate processors operating jointly.

FIG. 5 illustrates a structure similar to that of FIG. 3B, but in which the initial guess of the object's location and attitude block 30 is replaced by a separate navigation arrangement, which may be a prior-art navigation arrangement. Block 30 could be, for example, an inertial navigation sensor/sensor system (accelerometer and gyroscope) which determines the location and attitude of the object to within a certain accuracy. Block 30 could be a GPS navigator, and could also be a man with a sextant and compass, or any other prior art arrangement. A major advantage of use of such a prior art system to generate the initial guess is that the time required for the navigation system 300 to settle or converge to a solution is reduced. A major advantage of the navigation system according to an aspect of the invention, is that if the conventional or prior-art navigation system becomes nonfunctional, as for example due to destruction of GPS satellites or other interruption, the magnetic-based system according to an aspect of the invention will persist, and navigate from the last known update, so long as the Earth's magnetic field continues unabated.

Unlike navigation systems which actively broadcast energy in order to obtain details of position, a system according to some aspects of the invention is passive, and less likely to be detected or interfered with than such an active system.

A magnetic navigation device (300) according to an aspect of the invention comprises a three-axis magnetometer (303) including first (200x), second (200y) and third (200z) single-axis channels oriented mutually orthogonally, in which each of the first (x), second (y) and third (z) channels is responsive to Earth's magnetic field (6) for generating measured signal ($\hat{B}x(kt)$, $\hat{B}y(kt)$, and $\hat{B}z(kt)$) proportional to the component of the magnetic field (6) in the direction of the channel. The magnetic navigation device (300) also comprises a source (22) of reference Earth magnetic field component information (Bx(kt), By(kt), Bz(kt)) responsive to corrected device location and attitude signal (58). First (310x), second (310y), and third (310z) error detectors are provided, each including a sum (+) input port and a difference (−) input port, and each also including an output port. The sum (+) input ports of the first (301x), second (301y) and third (301) error detectors are coupled to receive the measured signal ($\hat{B}x(kt)$, $\hat{B}y(kt)$, and $\hat{B}z(kt)$) from the first (x), second (y) and third (z) channels, respectively. The difference (−) input ports of each of the first (310x), second (310y), and third (310z) error detectors are coupled to receive the reference Earth magnetic field component information ((Bx(kt), By(kt), Bz(kt)), for subtracting from the measured signals ($\hat{B}x(kt)$, $\hat{B}y(kt)$, and $\hat{B}z(kt)$) the corresponding component (Bx(kt), By(kt), Bz(kt)) of the reference Earth magnetic field component information to thereby generate, in each of the first (x), second (y) and third (z) channels, magnetic field difference signals (δBx(kt), δBy(kt), and δBz(kt)) representing the difference between the measured magnetic fields ($\hat{B}x(kt)$, $\hat{B}y(kt)$, and $\hat{B}z(kt)$) at the location and the reference or library Earth magnetic field component information (Bx(kt), By(kt), Bz(kt)) at the location. A first processor (21) is provided, for assembling the magnetic field difference signals ((δBx(kt), δBy(kt), and δBz(kt)) into a difference column vector (21V) representing the magnetic field differences between the measured magnetic field and the reference (estimated) magnetic field values at the location. A source (24, 25, 26, 63) is provided of inverted differential correction matrix or matrices (26M) responsive to a corrected device location and attitude vector (58). The inverted differential correction matrix (26M) represents the pseudo inverse of an attitude and location sensitivity matrix providing directional action for the reference magnetic field. A vector matrix multiplier (28) includes a first input port (28i1) coupled to the first processor (21), for receiving the difference column vector (21V) at the first input port (28i1), and also includes a second input port (28i2) coupled to receive the inverted differential correction matrix (26m). The vector matrix multiplier (28) multiplies the difference column vector (21V) by the inverted differential correction matrix (26m), for generating a column vector (29) representing corrections to the corrected device location and attitude vector (58). A source (30) of ancillary signals (31) is provided. The ancillary signals (31) are one of (a) initial estimated device location and attitude (31) and (b) estimated device location and attitude from an independent navigation location estimator (530). A vector differencing processor (56) includes an inverting (−) input port (56i1) and a noninverting (+) input port (56i2). The inverting (−) input port (56i1) of the vector differencing processor (56) is coupled to the vector matrix multiplier (28) for receiving the corrections to the corrected location and attitude vector (29), and the noninverting (+) input port (56i2) is coupled to the source (30,530) of ancillary signals (31). The vector differencing processor (56) takes the difference between the ancillary signals (31) and the corrections to the location and attitude vector (29), for thereby generating a corrected device location and attitude column vector (58) representing the corrected device location and attitude.

In a particular embodiment of a magnetic navigation system, the source (24, 25, 26, 63) of inverted differential correction matrix (26m) comprises a further or magnetic field gradient correction matrix processor (24) responsive to the corrected device location and attitude vector (58), for generating a magnetic field gradient correction matrix (H or 61) representing the spatial or 3-dimensional rate of change of the Earth's magnetic field as a function of the corrected location and attitude. A scalar-to-column-vector processor (63) is coupled to the source (22) of reference Earth magnetic field component information (Bx(kt), By(kt), Bz(kt)) for converting the reference Earth magnetic field component information (Bx(kt), By(kt), Bz(kt)) from scalar form into column vector form (64). A matrix assembly processor (25) is coupled to the further or magnetic field gradient correction matrix processor (24) for receiving the magnetic field gradient correction matrix (H 61), and coupled to the scalar-to-column-vector processor (63) for receiving the column vector (64), for forming a skew-symmetric matrix (25M1) of the column vector (64), and for multiplying the column vector (64) by the magnetic field gradient correction matrix (61) to form a product (25M2), and for column formatting the skew-symmetric matrix (25M1) with the product matrix(25M2) to form an overall magnetic field gradient correction matrix (25M). A Moore-Penrose pseudoinverse processor (26) is coupled to the matrix assembly processor (25) for generating the Moore-Penrose pseudoinverse of the magnetic field gradient correction matrix (25M) to thereby generate the inverted differential correction matrix (26*m*).

In a particular embodiment of a three-axis magnetometer (303) according to an aspect of the invention, each of the three axes (x,y,z) includes a photoresponsive solid-state crystalline device (1) with lattice imperfections (V) associated with certain electrons, which lattice imperfections electrons resonate at a given wavelength (532 nm). Each channel (x, y, or z) further includes a source (17) of timed sequential pairs of light pulses (220) at the given wavelength (532 nm). The source (17) is directed toward the crystalline device (1 in FIG. 2), whereby (a) the first of the pulses (9) of each pair of light pulses raises the energy state of the electrons (10) over a ground state, thereby creating distinct (+½ and −½) quantum spin state populations, and (b) the second (11) of the pulses of each pair of pulses occurs at a time such that the energy state of the electrons is reduced to the ground state, whereby (c) the reduction of the energy state generates photons (12) which exit the crystalline device (1). The number of photons (12) exiting the crystalline device (1) is related to the magnitude of a component of the magnetic field (B(t)) through the crystalline device (1). A photon (12) detector (13) responds to the photons and generates an electrical signal (S(t)) in response to the photons (12). An analog-to-digital converter (301) converts the electrical signal (S(t)) into digital form.

A method for navigation according to an aspect of the invention includes the steps of sensing (303) the Earth's magnetic fields at the current location, to thereby generate measured three-dimensional magnetic fields ($\hat{B}x(kt)$, $\hat{B}y(kt)$, and $\hat{B}z(kt)$), and addressing a reference library of magnetic values (22) with at least a portion of a column vector $$\begin{bmatrix} x \\ y \\ z \\ \Theta_x \\ \Theta_y \\ \Theta_z \end{bmatrix}$$

(58) representing a corrected estimate of location and attitude, to thereby obtain library values (Bx(kt), By(kt), and Bz(kt)) of the magnetic fields at the corrected estimated location. The method further comprises the step of applying the measured three-dimensional magnetic fields ($\hat{B}x(kt)$, $\hat{B}y(kt)$, and $\hat{B}z(kt)$) and the library values (Bx(kt), By(kt), and Bz(kt)) of the magnetic fields at the corrected estimated location to ports of error amplifiers (310), to thereby generate three scalar quantities representing difference signals (δBx(kt), δBy(kt), and δBz(kt)) between the values of the measured magnetic fields and the library values of the magnetic fields at the corrected estimated location. The three scalar quantities (δBx(kt), δBy(kt), and δBz(kt)) representing difference signals are converted (21) into column vector form:

$$\begin{bmatrix} \delta B_x(kt) \\ \delta B_y(kt) \\ \delta Bz(kt) \end{bmatrix}$$

(21V). The column vector (21V) representing difference signals is applied to a first input port (28*i*1) of a vector matrix multiplier (28), and a gradient correction matrix (26*m*) is applied to a second input port (28*i*2) of the vector matrix multiplier (28). Matrix multiplication is performed in the vector matrix multiplication block (28) to thereby produce a column vector $$\begin{bmatrix} \delta x(kt) \\ \delta y(kt) \\ \delta z(kt) \\ \delta\Theta_x(kt) \\ \delta\Theta_y(kt) \\ \delta\Theta_z(kt) \end{bmatrix}$$

(29), representing the correction to the corrected estimated location and attitude (58). The current location is estimated (30), to thereby generate an estimated location and attitude column vector $$\begin{bmatrix} \hat{x} \\ \hat{y} \\ \hat{z} \\ \hat{\Theta}_x \\ \hat{\Theta}_y \\ \hat{\Theta}_z \end{bmatrix}$$

(31). The column vector $$\begin{bmatrix} \delta x(kt) \\ \delta y(kt) \\ \delta z(kt) \\ \delta\Theta_x(kt) \\ \delta\Theta_y(kt) \\ \delta\Theta_z(kt) \end{bmatrix}$$

(29), representing the correction to the corrected estimate of the location and attitude, is subtracted (56) from the column vector (31) representing estimated location and attitude, to thereby generate the column vector (58) representing a corrected estimate of the location and attitude.

A particular mode of the method includes the step of forming (63) the library values (Bx(kt), By(kt), and Bz(kt)) of the magnetic fields at the corrected estimated location into a library value column vector (64)

$$\begin{bmatrix} B_x(kt) \\ B_y(kt) \\ B_z(kt) \end{bmatrix}$$

(64). A magnetic field gradient correction matrix $$H = \begin{bmatrix} \frac{\delta Bxx}{\delta x} & \frac{\delta Bxy}{\delta x} & \frac{\delta Bxz}{\delta x} \\ \frac{\delta Byx}{\delta y} & \frac{\delta Byy}{\delta y} & \frac{\delta Byz}{\delta y} \\ \frac{\delta Bzx}{\delta z} & \frac{\delta Bzy}{\delta z} & \frac{\delta Bzz}{\delta z} \end{bmatrix}$$

(61) is generated (24), which represents correction of the gradient of the column vector (64) representing the library values. Matrix assembly processing (25) is performed on the magnetic field gradient correction matrix (61) and the library value column vector (64), to thereby generate a differential correction matrix (R 25M) including (a) a skew-symmetric submatrix ([B̂(kt)]) which is the skew-symmetric matrix of the library value column vector (64) and also including (b) a submatrix (25M2) which is the product (H(kt)B(kt)) of the magnetic field gradient correction matrix (61) multiplied by the Cartesian magnetic field column vector (64). Moore-Penrose pseudoinverse processing is performed (26) on the differential correction matrix (R 25M) to thereby generate the gradient correction matrix (26m).

Another method according to an aspect of the invention comprises the steps of sensing (303) the Earth's magnetic fields at the current location, to thereby generate measured three-dimensional magnetic fields (B̂x(kt), B̂y(kt), and B̂z(kt)), and addressing a reference library of magnetic values (22) with at least a portion of a column vector $$\begin{bmatrix} x \\ y \\ z \\ \Theta_x \\ \Theta_y \\ \Theta_z \end{bmatrix}$$

(58) representing a corrected estimate of location and attitude, to thereby obtain library values (Bx(kt), By(kt), and Bz(kt)) of the magnetic fields at the corrected estimated location. Three scalar quantities (δBx(kt), δBy(kt), and δBz(kt)) representing error signals are generated (310) by taking the differences between the measured three-dimensional magnetic fields (B̂x(kt), B̂y(kt), and B̂z(kt)) and the library values (Bx(kt), By(kt), and Bz(kt)) of the magnetic fields at the corrected estimated location. The three scalar quantities (δBx(kt), δBy(kt), and δBz(kt)) representing error signals are converted (21) into column vector form:

$$\begin{bmatrix} \delta B_x(kt) \\ \delta B_y(kt) \\ \delta Bz(kt) \end{bmatrix}$$

(21V). The column vector (21V) representing difference signals is multiplied (28) by a gradient correction matrix (26m), to thereby produce a column vector $$\begin{bmatrix} \delta x(kt) \\ \delta y(kt) \\ \delta z(kt) \\ \delta \Theta_x(kt) \\ \delta \Theta_y(kt) \\ \delta \Theta_z(kt) \end{bmatrix}$$

(29), representing the correction to the corrected estimated location and attitude (58). The current location is estimated (30) (or equivalently measured by a separate navigator), to thereby generate an estimated location and attitude column vector $$\begin{bmatrix} \hat{x} \\ \hat{y} \\ \hat{z} \\ \hat{\Theta}_x \\ \hat{\Theta}_y \\ \hat{\Theta}_z \end{bmatrix}$$

(31). The column vector $$\begin{bmatrix} \delta x(kt) \\ \delta y(kt) \\ \delta z(kt) \\ \delta \Theta_x(kt) \\ \delta \Theta_y(kt) \\ \delta \Theta_z(kt) \end{bmatrix}$$

(29), representing the correction to the corrected estimate of the location and attitude, is subtracted (56) from the column vector (31) representing estimated location and attitude, to thereby generate the column vector (58) representing a corrected estimate of the location and attitude.

A particular mode of this other method for navigation comprises the further steps of forming (63) the library values (Bx(kt), By(kt), and Bz(kt)) of the magnetic fields at the corrected estimated location into a library value column vector $$\begin{bmatrix} B_x(kt) \\ B_y(kt) \\ B_z(kt) \end{bmatrix}.$$

(64). A magnetic field gradient correction matrix is generated (24). The magnetic field gradient correction matrix $$H = \begin{bmatrix} \frac{\delta Bxx}{\delta x} & \frac{\delta Bxy}{\delta x} & \frac{\delta Bxz}{\delta x} \\ \frac{\delta Byx}{\delta y} & \frac{\delta Byy}{\delta y} & \frac{\delta Byz}{\delta y} \\ \frac{\delta Bzx}{\delta z} & \frac{\delta Bzy}{\delta z} & \frac{\delta Bzz}{\delta z} \end{bmatrix}$$

(61) represents correction of the gradient of the column vector (64) representing the library values. The magnetic field gradient correction matrix (61) and the library value column vector (64) are matrix assembled (25), to thereby generate a differential correction matrix (R 25M). The differential correction matrix (R 25M) includes (a) a skew-symmetric submatrix ([B̃(kt)]) which is the skew-symmetric matrix of the library value column vector (64) and also includes (b) a submatrix (25M2) which is the product (H(kt)B(kt)) of the magnetic field gradient correction matrix (61) multiplied by the Cartesian magnetic field column vector 64. Moore-Penrose pseudoinverse processing is performed (26) on the differential correction matrix (R 25M) to thereby generate the gradient correction matrix (26m).

What is claimed is:

1. A magnetic navigation device, comprising:
    a three-axis magnetometer including first, second and third single-axis channels oriented mutually orthogonally, in which each of said first, second and third channels comprises:
        a photoresponsive solid-state crystalline device with lattice imperfections, where electrons of said lattice imperfections resonate at a given wavelength;
        a source of timed sequential pairs of light pulses at said given wavelength, said source being directed toward said device, wherein:
            (a) a first of said pulses raises an energy state of said electrons over a ground state, thereby creating distinct quantum spin state populations, and
            (b) a second of said pulses occurs at a time such that the energy state of said electrons is reduced to said ground state, whereby the reduction of said energy state generates photons which exit said device, the number of photons exiting said device being related to the magnitude of a component of the magnetic field through said device; and
        a photon detector for responding to said photons and for generating an electrical signal in response to said photons, said electrical signal being proportional to the component of the magnetic field in the direction of the channel;
    wherein at least one of a latitude location and a longitudinal location of said device are determinable from said electrical signals of said first, second and third single-axis channels.

2. A magnetic navigation device according to claim 1, further comprising a source of reference Earth magnetic field component information, and a processor executing instructions for comparing said reference Earth magnetic field component information with said at least one of a latitude location and a longitudinal location determined from said electrical signals of said first, second and third single-axis channels.

3. A magnetic navigation device according to claim 2, further comprising first, second and third error detectors for receiving said electrical signals from the first, second and third channels, subtracting from said electrical signals corresponding components of said reference Earth magnetic field component information to generate magnetic field difference signals representing a difference between the measured magnetic fields at the location and the reference Earth magnetic field component information at the location.

4. A magnetic navigation device according to claim 1, further comprising an analog-to-digital converter, for converting said electrical signal into digital form.

5. A magnetic navigation device according to claim 1, wherein said given wavelength is 532 nm.

6. A magnetic navigation device according to claim 1, wherein said photoresponsive solid-state crystalline device comprises a nitrogen-vacancy diamond crystal sensor.

7. A magnetic navigation device according to claim 1, further comprising a wavelength selective mirror disposed between said photoresponsive solid-state crystalline device and said source of timed sequential pairs of light pulses.

8. A method for navigation, said method comprising the steps of:
    sensing the Earth's magnetic fields at a current location, to thereby generate measured three-dimensional magnetic fields;
    addressing a reference library of magnetic values with at least a portion of a column vector representing a corrected estimate of location and attitude of the current location, to thereby obtain library values of the magnetic fields at the corrected estimated location;
    generating three scalar quantities representing error signals by taking the differences between said measured three-dimensional magnetic fields and said library values of the magnetic fields at the corrected estimated location;
    converting said three scalar quantities representing error signals into column vector form:
    multiplying, using a processor, said column vector representing difference signals by a gradient correction matrix, to thereby produce a column vector representing the correction to the corrected estimated location and attitude;
    estimating a current location, to thereby generate an estimated location and attitude column vector; and
    subtracting said column vector representing the correction to the corrected estimate of the location and attitude, from said column vector representing estimated location and attitude, to generate said column vector representing a corrected estimate of said location and attitude.

9. A method according to claim 8, wherein the step of sensing the Earth's magnetic fields is performed using a photoresponsive solid-state crystalline device with lattice imperfections, where electrons of said lattice imperfections resonate at a given wavelength.

10. A method according to claim 9, wherein said given wavelength is 532 nm.

11. A method according to claim 8, further comprising the steps of:
    forming said library values of the magnetic fields at the corrected estimated location into a library value column vector;
    generating a magnetic field gradient correction matrix representing correction of the gradient of the column vector representing the library values;
    assembling said magnetic field gradient correction matrix and said library value column vector, to thereby generate a differential correction matrix including a skew-symmetric submatrix which is the skew-symmetric matrix of said library value column vector and also including a submatrix which is the product of the magnetic field gradient correction matrix multiplied by said Cartesian magnetic field column vector; and
    performing Moore-Penrose pseudoinverse processing on said differential correction matrix to generate said gradient correction matrix.

12. A magnetic navigation device, comprising:
    a three-axis magnetometer including first, second and third single-axis channels oriented mutually orthogonally, in which each of said first, second and third channels is responsive to Earth's magnetic field for generating a measured signal proportional to the component of the magnetic field in the direction of the channel;

a source of reference Earth magnetic field component information responsive to a corrected device location and attitude signal;

first, second, and third error detectors, each including a sum input port and a difference input port, and each also including an output port, said sum input ports of said first, second, and third error detectors being coupled to receive said measured signals from said first, second and third channels, said difference input ports of each of said first, second, and third error detectors being coupled to receive said reference Earth magnetic field component information, for subtracting from said measured signals the corresponding component of said reference Earth magnetic field component information to thereby generate, in each of said first, second and third channels, magnetic field difference signals representing the difference between the measured magnetic fields at the location and the reference Earth magnetic field component information at the location;

a first processor for assembling said magnetic field difference signals into a difference column vector representing the magnetic field differences between the measured magnetic field and the reference magnetic field values at said location;

a source of inverted differential correction matrix responsive to a corrected device location and attitude vector, said inverted differential correction matrix representing the pseudo inverse of an attitude and location sensitivity matrix of the reference magnetic field;

a vector matrix multiplier including a first input port coupled to said first processor, for receiving said difference column vector at said first input port, and also including a second input port coupled to receive said inverted differential correction matrix, for multiplying said difference column vector by said inverted differential correction matrix, for generating a column vector representing corrections to the corrected device location and attitude vector;

a source of ancillary signals, said source of ancillary signals generating one of (a) initial estimated device location and attitude and (b) estimated device location and attitude from an independent navigation location estimator;

a vector differencing processor including an inverting input port and a noninverting input port, said inverting input port being coupled to said vector matrix multiplier for receiving said corrections to said corrected location and attitude vector, said noninverting input port being coupled to said source of ancillary signals, for taking the difference between said corrections to said location and attitude vector and said ancillary signals, for thereby generating a column vector representing the corrected device location and attitude.

13. A magnetic navigation device according to claim 12, wherein said source of inverted differential correction matrix further comprises:

a magnetic field gradient correction matrix processor responsive to the corrected device location and attitude vector, for generating a magnetic field gradient correction matrix representing the spatial or 3-dimensional rate of change of the Earth's magnetic field as a function of the corrected device location and attitude;

a scalar-to-column-vector processor coupled to said source of reference Earth magnetic field component information for converting said reference Earth magnetic field component information from scalar form into column vector form;

a matrix assembly processor coupled to said or magnetic field gradient correction matrix processor for receiving said magnetic field gradient correction matrix, and coupled to said scalar-to-column-vector processor for receiving said column vector, for forming a skew-symmetric matrix of said column vector, and for multiplying said column vector by said magnetic field gradient correction matrix to form a product, and for column formatting said skew-symmetric matrix with said product to form a magnetic field gradient correction matrix;

a Moore-Penrose pseudoinverse processor coupled to said matrix assembly processor for generating the Moore-Penrose pseudoinverse of said magnetic field gradient correction matrix to thereby generate said inverted differential correction matrix.

14. A magnetic navigation device according to claim 12, wherein said three-axis magnetometer comprises:

first, second and third single-axis channels, in which each of said first, second and three channels includes:

a photoresponsive solid-state crystalline device with lattice imperfections associated with certain electrons, which lattice imperfections electrons resonate at a given wavelength;

a source of timed sequential pairs of light pulses at said given wavelength, said source being directed toward said device, whereby (a) the first of said pulses of each pair of light pulses raises the energy state of said electrons over a ground state, thereby creating distinct quantum spin state populations, and (b) said second of said pulses of each pair of pulses occurs at a time such that the energy state of said electrons is reduced to said ground state, whereby (c) the reduction of said energy state generates photons which exit said device, the number of photons exiting said device being related to the magnitude of a component of the magnetic field through said device;

a photon detector for responding to said photons and for generating an electrical signal in response to said photons; and an analog-to-digital converter, for converting said electrical signal into digital form.

15. A magnetic navigation device, comprising:

a three-axis solid-state magnetometer including first, second and third single-axis channels, in which each of said first, second and three channels includes:

a photoresponsive solid-state crystalline device with lattice imperfections associated with certain electrons, which lattice imperfections electrons resonate at a given wavelength;

a source of timed sequential pairs of light pulses at said given wavelength, said source being directed toward said device, whereby (a) the first of said pulses of each pair of light pulses raises the energy state of said electrons over a ground state, thereby creating distinct quantum spin state populations, and (b) said second of said pulses of each pair of pulses occurring at a time such that the energy state of said electrons is reduced to said ground state, whereby (c) the reduction of said energy state generates photons which exit said device, the number of photons exiting said device being related to the magnitude of a component of the magnetic field through said device; and a photon detector for responding to said photons and for generating an electrical signal in response to said photons;

an analog-to-digital converter, for converting said electrical signal into digital form;

said magnetic navigation device further comprising:
a source of reference Earth magnetic field component information responsive to corrected device location and attitude signal;
first, second, and third error detectors, each including a sum input port and a difference input port, and each also including an output port, said sum input ports of said first, second and third error detectors being coupled to receive said electrical signals in digital form from said analog-to-digital converters of said first, second and third channels, said difference input ports of each of said first, second, and third error detectors being coupled to receive said reference Earth magnetic field component information, for subtracting from said electrical signals the corresponding component of said reference Earth magnetic field component information to thereby generate, in each of said first, second and third channels, magnetic field difference signals representing the difference between the measured magnetic fields at the location and the reference Earth magnetic field component information at the location;
a first processor for assembling said magnetic field difference signals into a difference column vector representing the magnetic field differences between the measured magnetic field and the reference magnetic field values at said location;
a source of inverted differential correction matrix responsive to a corrected device location and attitude vector, said inverted differential correction matrix representing the pseudo inverse of an attitude and location sensitivity matrix of the reference magnetic field;
a vector matrix multiplier including a first input port coupled to said first processor, for receiving said difference column vector at said first input port, and also including a second input port coupled to receive said inverted differential correction matrix, for multiplying said difference column vector by said inverted differential correction matrix, for generating a column vector representing corrections to the corrected device location and attitude vector;
a source of ancillary signals, said ancillary signals being one of (a) initial estimated device location and attitude and (b) estimated device location and attitude from an independent navigation location estimator;
a vector differencing processor including an inverting input port and a noninverting input port, said inverting input port being coupled to said vector matrix multiplier for receiving said corrections to said corrected location and attitude vector, said noninverting input port being coupled to said source of ancillary signals, for taking the difference between said corrections to said location and attitude vector and said ancillary signals, for thereby generating a column vector representing the corrected device location and attitude.

16. A magnetic navigation system according to claim 15, wherein said source of inverted differential correction matrix further comprises:
a magnetic field gradient correction matrix processor responsive to the corrected device location and attitude vector, for generating a magnetic field gradient correction matrix representing the spatial or 3-dimensional rate of change of the Earth's magnetic field as a function of the corrected location and attitude;
a scalar-to-column-vector processor coupled to said source of reference Earth magnetic field component information for converting said reference Earth magnetic field component information from scalar form into column vector form;
a matrix assembly processor is coupled to said or magnetic field gradient correction matrix processor for receiving said magnetic field gradient correction matrix, and coupled to said scalar-to-column-vector processor for receiving said column vector, for forming a skew-symmetric matrix of said column vector, and for multiplying said column vector by said magnetic field gradient correction matrix to form a product, and for column formatting said skew-symmetric matrix with said product to form a magnetic field gradient correction matrix;
a Moore-Penrose pseudoinverse processor coupled to said matrix assembly processor for generating the Moore-Penrose pseudoinverse of said magnetic field gradient correction matrix to thereby generate said inverted differential correction matrix.

17. A method for navigation, said method comprising the steps of:
sensing the Earth's magnetic fields at the current location, to thereby generate measured three-dimensional magnetic fields ($\hat{B}x(kt)$, $\hat{B}y(kt)$, and $\hat{B}z(kt)$);
addressing a reference library of magnetic values with at least a portion of a column vector $$\begin{bmatrix} x \\ y \\ z \\ \Theta_x \\ \Theta_y \\ \Theta_z \end{bmatrix}$$

representing a corrected estimate of location and attitude, to thereby obtain library values ($Bx(kt)$, $By(kt)$, and $Bz(kt)$) of the magnetic fields at the corrected estimated location;
applying said measured three-dimensional magnetic fields ($\hat{B}x(kt)$, $\hat{B}y(kt)$, and $\hat{B}z(kt)$) and said library values ($Bx(kt)$, $By(kt)$, and $Bz(kt)$) of the magnetic fields at the corrected estimated location to ports of error amplifiers, to thereby generate three scalar quantities representing difference signals ($\delta Bx(kt)$, $\delta By(kt)$, and $\delta Bz(kt)$) between the values of the measured magnetic fields and the library values of the magnetic fields at the corrected estimated location;
converting said three scalar quantities ($\delta Bx(kt)$, $\delta By(kt)$, and $\delta Bz(kt)$) representing difference signals into column vector form:

$$\begin{bmatrix} \delta B_x(kt) \\ \delta B_y(kt) \\ \delta Bz(kt) \end{bmatrix};$$

applying said column vector representing difference signals to a first input port of a vector matrix multiplier, and applying a gradient correction matrix to a second input port of said vector matrix multiplier, and performing vector matrix multiplication to thereby produce a column vector $$\begin{bmatrix} \delta x(kt) \\ \delta y(kt) \\ \delta z(kt) \\ \delta\Theta_x(kt) \\ \delta\Theta_y(kt) \\ \delta\Theta_z(kt) \end{bmatrix},$$

representing the correction to the corrected estimated location and attitude;

estimating the current location, to thereby generate an estimated location and attitude column vector $$\begin{bmatrix} \hat{x} \\ \hat{y} \\ \hat{z} \\ \hat{\Theta}_x \\ \hat{\Theta}_y \\ \hat{\Theta}_z \end{bmatrix};$$

subtracting said column vector $$\begin{bmatrix} \delta x(kt) \\ \delta y(kt) \\ \delta z(kt) \\ \delta\Theta_x(kt) \\ \delta\Theta_y(kt) \\ \delta\Theta_z(kt) \end{bmatrix},$$

representing the correction to the corrected estimate of the location and attitude, from said column vector representing estimated location and attitude, to thereby generate said column vector representing a corrected estimate of said location and attitude.

18. A method according to claim 17, further comprising the steps of:

forming said library values (Bx(kt), By(kt), and Bz(kt)) of the magnetic fields at the corrected estimated location into a library value column vector $$\begin{bmatrix} B_x(kt) \\ B_y(kt) \\ B_z(kt) \end{bmatrix};$$

generating a magnetic field gradient correction matrix $$H = \begin{bmatrix} \frac{\delta Bxx}{\delta x} & \frac{\delta Bxy}{\delta x} & \frac{\delta Bxz}{\delta x} \\ \frac{\delta Byx}{\delta y} & \frac{\delta Byy}{\delta y} & \frac{\delta Byz}{\delta y} \\ \frac{\delta Bzx}{\delta z} & \frac{\delta Bzy}{\delta z} & \frac{\delta Bzz}{\delta z} \end{bmatrix}$$

representing correction of the gradient of the column vector representing the library values;

performing matrix assembly processing on said magnetic field gradient correction matrix and said library value column vector, to thereby generate a differential correction matrix including (a) a skew-symmetric submatrix which is the skew-symmetric matrix of said library value column vector and also including (b) a submatrix which is the product of the magnetic field gradient correction matrix multiplied by said library value column vector;

performing Moore-Penrose pseudoinverse processing on said differential correction matrix to thereby generate said gradient correction matrix.

19. A method for navigation, said method comprising the steps of:

sensing the Earth's magnetic fields at a current location, to thereby generate measured three-dimensional magnetic fields ($\hat{B}x(kt)$, $\hat{B}y(kt)$, and $\hat{B}z(kt)$);

addressing a reference library of magnetic values with at least a portion of a column vector $$\begin{bmatrix} x \\ y \\ z \\ \Theta_x \\ \Theta_y \\ \Theta_z \end{bmatrix}$$

representing a corrected estimate of location and attitude of the current location, to thereby obtain library values (Bx(kt), By(kt), and Bz(kt)) of the magnetic fields at the corrected estimated location;

generating three scalar quantities ($\delta Bx(kt)$, $\delta By(kt)$, and $\delta Bz(kt)$) representing error signals by taking the differences between said measured three-dimensional magnetic fields ($\hat{B}x(kt)$, $\hat{B}y(kt)$, and $\hat{B}z(kt)$) and said library values (Bx(kt), By(kt), and Bz(kt)) of the magnetic fields at the corrected estimated location;

converting said three scalar quantities ($\delta Bx(kt)$, $\delta By(kt)$, and $\delta Bz(kt)$) representing error signals into column vector form:

$$\begin{bmatrix} \delta B_x(kt) \\ \delta B_y(kt) \\ \delta Bz(kt) \end{bmatrix};$$

multiplying said column vector representing difference signals by a gradient correction matrix, to thereby produce a column vector $$\begin{bmatrix} \delta x(kt) \\ \delta y(kt) \\ \delta z(kt) \\ \delta\Theta_x(kt) \\ \delta\Theta_y(kt) \\ \delta\Theta_z(kt) \end{bmatrix},$$

representing the correction to the corrected estimated location and attitude;

estimating the current location, to thereby generate an estimated location and attitude column vector $$\begin{bmatrix} \hat{x} \\ \hat{y} \\ \hat{z} \\ \hat{\Theta}_x \\ \hat{\Theta}_y \\ \hat{\Theta}_z \end{bmatrix};$$

subtracting said column vector $$\begin{bmatrix} \delta x(kt) \\ \delta y(kt) \\ \delta z(kt) \\ \delta \Theta_x(kt) \\ \delta \Theta_y(kt) \\ \delta \Theta_z(kt) \end{bmatrix},$$

representing the correction to the corrected estimate of the location and attitude, from said column vector representing estimated location and attitude, to thereby generate said column vector representing a corrected estimate of said location and attitude.

20. A method according to claim 19, further comprising the steps of:

forming said library values (Bx(kt), By(kt), and Bz(kt)) of the magnetic fields at the corrected estimated location into a library value column vector $$\begin{bmatrix} B_x(kt) \\ B_y(kt) \\ B_z(kt) \end{bmatrix};$$

Generating a magnetic field gradient correction matrix $$H = \begin{bmatrix} \dfrac{\delta Bxx}{\delta x} & \dfrac{\delta Bxy}{\delta x} & \dfrac{\delta Bxz}{\delta x} \\ \dfrac{\delta Byx}{\delta y} & \dfrac{\delta Byy}{\delta y} & \dfrac{\delta Byz}{\delta y} \\ \dfrac{\delta Bzx}{\delta z} & \dfrac{\delta Bzy}{\delta z} & \dfrac{\delta Bzz}{\delta z} \end{bmatrix}$$

representing correction of the gradient of the column vector representing the library values;

matrix assembling said magnetic field gradient correction matrix and said library value column vector, to thereby generate a differential correction matrix including (a) a skew-symmetric submatrix which is the skew-symmetric matrix of said library value column vector and also including (b) a submatrix which is the product of the magnetic field gradient correction matrix multiplied by said library value column vector;

performing Moore-Penrose pseudoinverse processing on said differential correction matrix to thereby generate said gradient correction matrix.

\* \* \* \* \*